United States Patent
Kumashiro et al.

(10) Patent No.: US 9,228,100 B2
(45) Date of Patent: Jan. 5, 2016

(54) LIQUID COMPOSITION, AND RESISTOR FILM, RESISTOR ELEMENT AND CIRCUIT BOARD USING SAME

(75) Inventors: Yasushi Kumashiro, Tsukuba (JP); Naoki Maruyama, Tsukuba (JP); Maki Inada, Tsukuba (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 145 days.

(21) Appl. No.: 13/814,293

(22) PCT Filed: Aug. 4, 2011

(86) PCT No.: PCT/JP2011/067893
§ 371 (c)(1),
(2), (4) Date: Mar. 7, 2013

(87) PCT Pub. No.: WO2012/018091
PCT Pub. Date: Feb. 9, 2012

(65) Prior Publication Data
US 2013/0153834 A1 Jun. 20, 2013

(30) Foreign Application Priority Data

Aug. 6, 2010 (JP) ................. P2010-177378
Aug. 6, 2010 (JP) ................. P2010-177379

(51) Int. Cl.
*H01B 1/06* (2006.01)
*H01B 1/24* (2006.01)
(Continued)

(52) U.S. Cl.
CPC ............... *C09D 11/324* (2013.01); *C08K 3/04* (2013.01); *C08K 5/1535* (2013.01); *C08K 7/24* (2013.01);
(Continued)

(58) Field of Classification Search
CPC .......... C23C 18/06; H05K 3/105; C08K 3/04; H01B 1/24

USPC ................... 252/507, 511; 423/447.1, 449.1; 347/105
See application file for complete search history.

(56) References Cited

U.S. PATENT DOCUMENTS 3,808,576 A    4/1974 Castonguay et al.
7,141,184 B2 *  11/2006 Chacko ................. 252/507
(Continued)

FOREIGN PATENT DOCUMENTS

CN    101597396    12/2009
JP    S57-003234   1/1982
(Continued)

OTHER PUBLICATIONS

Knovel Solvent—A Properties Database http://app.knovel.com/web/view/itable/show.v/rcid:kpKSAPD005/cid:kt005XWNN1/viewerType:eptble/root_slug:knovel-solvents-properties/url_slug:vapor-pressure#url_slug:vapor-pressure?q=material_or_substance_name:%22n-methylpyrrolidone%22%20AND%20vapor_pressure_mf:%5B%20*%20TO%20*%20%5D&b-q=material_or_substance_na.*

(Continued)

*Primary Examiner* — Khanh Tuan Nguyen
(74) *Attorney, Agent, or Firm* — Fitch, Even, Tabin and Flannery LLP

(57) ABSTRACT

There is provided a liquid composition that can form a resistor exhibiting a stable resistance value. One mode of the liquid composition of the invention is a liquid composition comprising (a) an epoxy resin, (b) carbon black particles, (c) carbon nanotubes and (d) a solvent with a vapor pressure of less than $1.34 \times 10^3$ Pa at 25° C.

12 Claims, 4 Drawing Sheets

(51) Int. Cl.
*C09D 11/324* (2014.01)
*C08K 3/04* (2006.01)
*C08K 7/24* (2006.01)
*H01C 7/00* (2006.01)
*H01C 17/065* (2006.01)
*C09D 11/52* (2014.01)
*H05K 1/16* (2006.01)
*C08K 5/1535* (2006.01)
*C09D 11/36* (2014.01)
*C09D 11/38* (2014.01)
*C09D 163/00* (2006.01)
*C08L 63/00* (2006.01)
*B82Y 99/00* (2011.01)

(52) U.S. Cl.
CPC ............... *C09D 11/36* (2013.01); *C09D 11/38* (2013.01); *C09D 11/52* (2013.01); *C09D 163/00* (2013.01); *H01B 1/24* (2013.01); *H01C 7/003* (2013.01); *H01C 17/0652* (2013.01); *H01C 17/06593* (2013.01); *H05K 1/167* (2013.01); *B82Y 99/00* (2013.01); *C08K 2003/045* (2013.01); *C08K 2201/005* (2013.01); *C08K 2201/011* (2013.01); *C08L 63/00* (2013.01); *H05K 2201/026* (2013.01); *H05K 2201/0323* (2013.01); *Y10S 977/742* (2013.01)

(56) References Cited

U.S. PATENT DOCUMENTS

2003/0100653 A1    5/2003   Chacko
2006/0001726 A1*   1/2006   Kodas et al. .................. 347/105
2009/0165314 A1*   7/2009   Khoshnood .................... 33/265
2012/0114549 A1*   5/2012   Chenevier ................. 423/447.1

FOREIGN PATENT DOCUMENTS

| | | | | |
|---|---|---|---|---|
| JP | 2001-019891 | * | 1/2001 | ............ C09D 17/00 |
| JP | 2003-80694 | | 3/2003 | |
| JP | 2003-110242 | | 4/2003 | |
| JP | 2005-507146 | | 3/2005 | |
| JP | 2006-140142 | | 6/2006 | |
| JP | 2006-269588 | | 10/2006 | |
| JP | 2007-165708 | * | 6/2007 | ............... H01C 7/00 |
| JP | 2010-514886 | | 5/2010 | |
| WO | WO 03/036661 A2 | | 5/2003 | |

OTHER PUBLICATIONS

CN Office Action of Appln. No. 201180037723.3 dated Apr. 29, 2014.

Limitations of Miniaturization of Equipment thrown Off by Ink Jet Jet of Nano-Scale Metal Particles Paves of Way for Further Miniaturization, Nikkei Electronics, Jun. 17, 2002, pp. 67-78 with partial English translation.

International Search Report of PCT/JP2011/067893 mailed Oct. 25, 2011 in English.

Office Action of PCT/JP2011/067893 mailed Sep. 6, 2011.

Translation of International Preliminary Report on Patentability of Appln. PCT/JP2011/067893 dated Mar. 21, 2013 in English.

TW Office Action of Appln. No. 100127990 dated Jan. 20, 2014.

* cited by examiner

LIQUID COMPOSITION, AND RESISTOR FILM, RESISTOR ELEMENT AND CIRCUIT BOARD USING SAME

TECHNICAL FIELD

The present invention relates to a liquid composition, and to a resistor film, a resistor element and a circuit board using it.

BACKGROUND ART

Multilayer printed circuit boards have conventionally been produced by steps including preparing a stack in which a plurality of one-sided printed circuit boards or double-sided printed circuit boards having a circuit formed by etching, are laminated by pressing via an adhesive layer such as a glass woven fabric prepreg, and a hole is opened in the stack using a drill or laser, after which a conductive layer is formed on the hole walls by plating or the like for electrical connection between the layers.

In recent years, methods of directly forming wiring patterns by printing methods are being investigated as substitutes for the conventional methods of producing multilayer printed circuit boards using etching or plating. For example, a method of forming a wiring pattern by ink jet printing (Patent document 1) and a method of producing a multilayer printed circuit board by forming a conductive layer and a hole-formed insulating layer on a substrate by a printing method (Patent document 2) have been proposed.

With these production methods, it is possible to produce a multilayer printed circuit board without using large-scale equipment such as pressing and plating equipment. An additional advantage is very high material usage efficiency, because the conductor ink or insulator ink can be printed only on the necessary sections.

At the same time, advances are being made in thickness reduction and high densification of circuit boards, to meet the needs for miniaturization and lighter weights of electronic devices in recent years. In addition, for electronic devices in the fields of data transmission and information processing, it is becoming ever more essential to accomplish efficient securing of mounting areas for mounting of high-performance parts. In the attempt to secure mounting areas, research has been carried out on miniaturization of surface mounting parts, narrow-pitch formation of terminals and fine patterning of boards, SMT (surface mounting technology) for high-density mounting of parts on board surfaces, and Advanced SMT which is a higher level of the same technology.

However, the numbers of active element parts (chip parts) have been increasing to meet the needs of higher functioning for electronic devices. As the number of passive element parts (capacitors, inductors and registers) that perform electrical regulating is likewise increasing, the mounting areas of such passive element parts often occupy more than half of the entirety. This has constituted an obstacle against miniaturization and higher performance of electronic devices.

Techniques for building passive element functions into boards are also being investigated. Such techniques promise not only miniaturization, but also effects such as improved reliability, by eliminating the conventional solder joints used for electrical connection between surface mounting parts and circuit boards, increased freedom of circuit design, improved electrical characteristics by reducing parasitic capacitance since passive elements can be effectively positioned internally, thereby shortening wiring lengths, and lower cost by eliminating the need for surface mounting.

Passive element-forming materials have therefore been developed with the purpose of providing passive element functions inside boards. For example, materials plated with relatively high-resistance metals have been used as resistors for built-in passive elements (Patent documents 3 and 4). There has also been proposed a method of forming resistors by ink jet printing, without the process of plating or etching (Non-patent document 1).

The present inventors have also proposed an ink comprising carbon black particles dispersed in a thermosetting resin, as a material that allows resistors of desired sizes to be formed at desired locations using an ink-jet apparatus (Patent document 5).

CITATION LIST

Patent Literature

[Patent document 1] Japanese Unexamined Patent Application Publication No. 2003-80694
[Patent document 2] Japanese Unexamined Patent Application Publication No. 2003-110242
[Patent document 3] Japanese Examined Patent Application Publication SHO No. 57-3234
[Patent document 4] U.S. Pat. No. 3,808,576
[Patent document 5] Japanese Unexamined Patent Application Publication No. 2007-165708

Non-Patent Literature

[Non-patent document 1] "Breakthrough in device miniaturization with ink-jet printing", Nikkei Electronics, 2002, No. 6/17, p. 67-78

SUMMARY OF INVENTION

Technical Problem

Patent document 1, however, mentions nothing regarding the ink that is to be used. Also, Patent document 2, while mentioning that a thermosetting resin is used in the ink for insulating layer formation, does not contain any specific reference to the ink viscosity or resin composition, or to inks having functions other than insulating layer formation. In addition, while Non-patent document 1 proposes forming a resistor by ink jet printing, it does not specifically mention the ink used to form the resistor.

Methods for forming resistors by offset printing have also been proposed in the prior art, but the inks used generally have viscosity higher than 20 Pa·s and a thixotropic property. Furthermore, inks for offset printing comprise conductive particles with mean particle sizes of 1 μm or greater, and such inks cannot be applied for ink jet printing. The inks used for ink jet printing are commonly preferred to have low viscosity, due to restrictions in the ink-jet head discharge system. When particles are included, the dispersion particle sizes are preferably small from the viewpoint of preventing nozzle clogging.

In light of these demands, the present inventors have proposed an ink comprising carbon black particles dispersed in a thermosetting resin (see Patent document 5, for example). The ink allows formation of resistors of prescribed sizes at prescribed locations using an ink-jet apparatus. Depending on the carbon black particles used, however, the resistance value is often unstable after curing and the resistance may differ even between different test pieces formed to the same shape. In addition, because a stable low resistance value is exhibited utilizing the percolation structure of the carbon black particles, a given type of carbon black particles can only exhibit a specific resistance value, and it has been necessary to select a new carbon black particle type to obtain a different resistance value (volume resistivity). In such cases, the new carbon black particles must be freshly examined for their dispersion stability and resistance value, as well as their ability to exhibit a stable resistance value, and this has been an obstacle against rapid material development.

The present invention has been accomplished in light of this problem, and its object is to provide a liquid composition that is suitable for forming resistors by ink jet printing and that can exhibit a stable resistance value, as well as a resistor film, resistor element and circuit board using the liquid composition.

Solution to Problem

In order to achieve the object stated above, the invention provides the following [1] to [22].

[1] A liquid composition comprising (a) an epoxy resin, (b) carbon black particles, (c) carbon nanotubes and (d) a solvent with a vapor pressure of less than $1.34 \times 10^3$ Pa at 25° C.

[2] A liquid composition according to [1] above, wherein the mean dispersion particle size of the (b) carbon black particles is no greater than 500 nm, and the maximum dispersion particle size is no greater than 2 μm.

[3] A liquid composition according to [1] or [2] above, wherein the outer diameter of the (c) carbon nanotubes is 3 nm or greater and the length is 100 nm or greater.

[4] A liquid composition according to any one of [1] to [3] above, wherein the content of the (b) carbon black particles is 10 to 80 vol %, based on the total solid volume of the liquid composition.

[5] A liquid composition according to any one of [1] to [4] above, wherein the content of the (c) carbon nanotubes is 0.1 to 20 parts by mass with respect to 100 parts by solid mass of the (b) carbon black particles.

[6] A liquid composition according to any one of [1] to [5] above, wherein the viscosity is no greater than 50 mPa·s at 25° C.

[7] A liquid composition according to any one of [1] to [6] above, wherein the (a) epoxy resin is a glycidyl etherified condensation product of a phenol and an aldehyde.

[8] A liquid composition according to any one of [1] to [7] above, which further comprises (e) a curing agent, the (e) curing agent comprising the condensation product of a phenol and an aldehyde.

[9] A liquid composition comprising (a1) a diol with a molecular weight of 40 or greater and less than 1000 and/or a resin containing the diol as a backbone, and (b) carbon black particles.

[10] A liquid composition according to [9] above, wherein the (a1) diol with a molecular weight of 40 or greater and less than 1000 and/or a resin containing the diol as a backbone includes (a2) an epoxy resin with a molecular weight of between 200 and 50,000, comprising a diol with a molecular weight of 40 or greater and less than 1000 in the backbone.

[11] A liquid composition according to [9] or [10] above, which further comprises (d) a solvent with a vapor pressure of less than $1.34 \times 10^3$ Pa at 25° C., and (e) a curing agent.

[12] A liquid composition according to [11] above, wherein the (e) curing agent comprises the condensation product of a phenol and an aldehyde.

[13] A liquid composition according to any one of [9] to [12] above, wherein the mean dispersion particle size of the (b) carbon black particles is no greater than 500 nm, and the maximum dispersion particle size is no greater than 2 μm.

[14] A liquid composition according to any one of [9] to [13] above, wherein the content of the (b) carbon black particles is 10 to 80 vol %, based on the total solid volume of the liquid composition.

[15] A liquid composition according to any one of [9] to [14] above, wherein the viscosity is no greater than 50 mPa·s at 25° C.

[16] A liquid composition according to any one of [9] to [15] above, which further comprises (c) carbon nanotubes.

[17] A liquid composition according to [16] above, wherein the outer diameter of the (c) carbon nanotubes is 3 nm or greater and the length is 100 nm or greater.

[18] A liquid composition according to [16] or [17] above, wherein the content of the (c) carbon nanotubes is 0.1 to 20 parts by mass with respect to 100 parts by solid mass of the (b) carbon black particles.

[19] A resistor film formed by removing the solvent from a liquid composition according to any one of [1] to [18] above by heating.

[20] A resistor film formed by printing or coating a liquid composition according to any one of [1] to [18] above on a substrate to form a film of the liquid composition, and removing the solvent from the film of the liquid composition by heating.

[21] A resistor element having a resistor film according to [19] or [20] above.

[22] A circuit board having a resistor element according to [21] above formed on a substrate.

Advantageous Effects of Invention

According to the invention it is possible to provide a liquid composition that is suitable for forming resistors by ink jet printing and that can exhibit a stable resistance value, as well as a resistor film, resistor element and circuit board using the liquid composition. The liquid composition of the invention also allows the resistance value to be varied by addition of CNT and selection of the resin composition, without completely retesting new carbon black particles. In addition, by using the liquid composition of the invention it is possible to form a resistor on a board by the simple method of ink jet printing, while also reducing environmental load created when using solder and the like, and facilitating formation of boards with built-in passive element functions.

DESCRIPTION OF EMBODIMENTS

Figure 1:
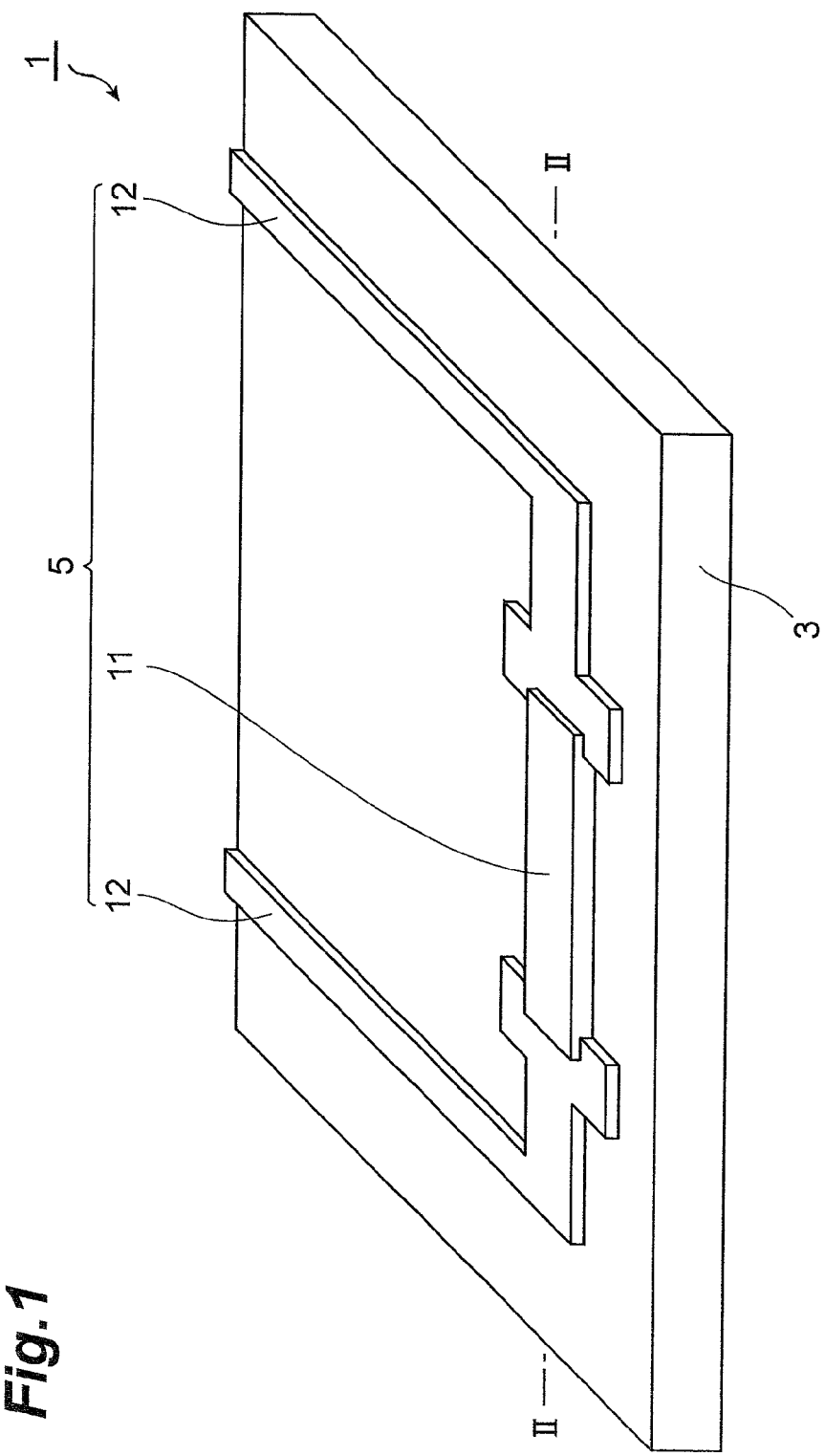
FIG. 1 is a perspective view of an embodiment of a circuit board of the invention.

Embodiments of the invention will now be described in detail. However, the present invention is not limited to the embodiments described below.

The liquid composition according to a first embodiment of the invention comprises (a) an epoxy resin, (b) carbon black particles, (c) carbon nanotubes and (d) a solvent with a vapor pressure of less than $1.34 \times 10^3$ Pa at 25° C., and also preferably (e) a curing agent.

The liquid composition according to a second embodiment of the invention comprises (a1) a diol with a molecular weight of 40 or greater and less than 1000 and/or a resin comprising the diol as a backbone (comprising a diol residue) and (b) carbon black particles, and preferably further comprises at least one of (c) carbon nanotubes, (d) a solvent with a vapor pressure of less than $1.34 \times 10^3$ Pa at 25° C., and (e) curing agents. The (a1) diol with a molecular weight of 40 or greater and less than 1000 and/or a resin containing the diol as a backbone preferably includes (a2) an epoxy resin with a molecular weight of between 200 and 50,000, comprising a diol with a molecular weight of 40 or greater and less than 1000 in the backbone (comprising a diol residue).

The liquid compositions according to the first and second embodiments may be suitably used to form resistors by a printing method such as ink jet printing, and both of the compositions contain carbon black particles. The components to be used in the liquid compositions of the first and second embodiments will now be explained.

The primary particle size of the (b) carbon black particles is preferably no greater than 100 nm, more preferably no greater than 80 nm and even more preferably no greater than 50 nm, from the viewpoint of adjusting the viscosity of the liquid composition to a viscosity suitable for printing, and from the viewpoint of exhibiting the resistance value with cured products. The primary particle size of the (b) carbon black particles is also preferably 10 nm or greater.

The dispersion particle size of the (b) carbon black particles affects the printability and resistance value stability. Therefore, the mean dispersion particle size of the (b) carbon black particles in the liquid composition is preferably no greater than 1000 nm, more preferably no greater than 500 nm and even more preferably no greater than 300 nm. Also, the maximum dispersion particle size of the (b) carbon black particles is preferably no greater than 5 μm, more preferably no greater than 2 μm and even more preferably no greater than 1 μm. If the mean dispersion particle size of the (b) carbon black particles is greater than 1000 nm or the maximum dispersion particle size is greater than 5 μm, clogging of the ink-jet head nozzle may occur and it will tend to be impossible to accomplish stable printing, when it is attempted to discharge the liquid composition by ink jet printing.

The mean dispersion particle size of the (b) carbon black particles is preferably 10 nm or greater. The maximum dispersion particle size of the (b) carbon black particles is also preferably 10 nm or greater.

Throughout the present specification, "dispersion particle size" refers to the particle size of particles that are dispersed in a liquid, and the values used in the present specification were measured using a submicron particle analyzer (Model N5) by Beckman Coulter, Inc.

The amount of (b) carbon black particles added is preferably 10 to 80 vol % and more preferably 10 to 70 vol %, based on the total solid volume of the liquid composition (the total solid volume remaining after removal of the solvent). If the amount added is less than 10 vol %, it will tend to be difficult to obtain the desired volume resistivity. If the amount of addition exceeds 80 vol %, problems will tend to result, such as increased viscosity of the liquid composition, and inability to maintain the strength of the resistor film after film formation.

The liquid composition of the invention may also comprise (c) carbon nanotubes (hereunder, "CNT"). The liquid composition of the first embodiment comprises CNT as an essential component, while the liquid composition of the second embodiment preferably comprises CNT. If the liquid composition comprises CNT, it will be possible to form a resistor with a lower and more stable resistance value.

CNT are largely of two types, single-walled (monolayer) and multi-walled (multilayer) types, and either CNT type may be used according to the invention. The outer diameter of the CNT is preferably 3 nm or greater. The length of the CNT is preferably 100 nm or greater and more preferably 300 nm or greater. This preferred dimensional range is in consideration of bridging between carbon black particles by the CNT. In order to ensure a satisfactory discharge property in an ink-jet apparatus, on the other hand, the length of the CNT is preferably no greater than 15 μm and the outer diameter of the CNT is preferably no greater than 1000 nm. When synthesized, CNT is generally in the form of groups of multiple CNTs known as "bundles". The bundles may be in any state so long as they are consistent throughout the material used, and in order to obtain a lower resistance value with the same amount of addition, the bundles are preferably loose. The CNT are preferably provided in the form of a dispersion, although this is not limitative. Using a dispersion state is preferred, since it can avoid adverse effects on the other materials during dispersion (for example, crushing of the particles or contamination with foreign components). The CNT dispersion used preferably comprises the CNT dispersed in the same solvent used to dissolve the resin or a solvent that is compatible with that solvent, from the viewpoint of ensuring stability of the dispersion.

The amount of CNT added is preferably 0.1 to 20 parts by mass and more preferably 0.1 to 10 parts by mass, with respect to 100 parts by solid mass of the (b) carbon black particles (solid mass remaining after removal of the solvent). If the amount of CNT addition is less than 0.1 part by mass, it will tend to be difficult to obtain a resistor with lower and more stable volume resistivity. If the amount of CNT addition is greater than 20 parts by mass, the viscosity of the liquid composition will increase more readily, and the potential for problems with the ink-jet discharge property will tend to increase.

The (a) epoxy resin to be used in a liquid composition according to the first embodiment may be, for example, a bisphenol A-type epoxy resin; a bisphenol F-type epoxy resin; a bisphenol S-type epoxy resin; a biphenol-type epoxy resin; an alicyclic epoxy resin; an aliphatic chain epoxy resin; a glycidyl ester-type epoxy resin; a glycidyl etherified condensation product of a phenol such as phenol, cresol, alkylphenol, catechol, bisphenol F, bisphenol A or bisphenol S with an aldehyde such as formaldehyde or salicylaldehyde; a glycidyl etherified product of a bifunctional phenol; a glycidyl etherified product of a bifunctional alcohol; a glycidyl etherified product of a polyphenol; or a hydrogenated or halogenated form of any of the foregoing. Preferred among these, from the viewpoint of heat resistance and connection reliability, are glycidyl etherified condensation products of phenols and aldehydes. There are no particular restrictions on the molecular weight of such (a) epoxy resins. The (a) epoxy resins may also be used alone or in combinations of two or more.

In a liquid composition according to the first embodiment, the content of the (a) epoxy resin is preferably selected to be such that the curing reaction completes within a prescribed heat curing time, after the carbon black, CNT and the curing agent and optional curing accelerator have been added. The content of the (a) epoxy resin is preferably 1 to 40 mass % and more preferably 1 to 30 mass %, as the proportion in the liquid composition. If the content is less than 1 mass % or greater than 40 mass %, the viscosity will tend to be unsuitable for printing.

The liquid composition according to the second embodiment comprises (a1) a diol with a molecular weight of 40 or greater and less than 1000 and/or a resin containing the diol as a backbone, and preferably also (a2) an epoxy resin with a molecular weight of between 200 and 50,000, comprising a diol with a molecular weight of 40 or greater and less than 1000 in the backbone.

Examples of diols with molecular weights of 40 or greater and less than 1000 include diols such as 1,2-ethanediol, 1,2-propanediol, 1,3-propanediol, 1,2-butanediol, 1,3-butanediol, 2,3-butanediol, 1,4-butanediol, 1,2-pentanediol, 1,3-pentanediol, 1,4-pentanediol, 2,3-pentanediol, 2,4-pentanediol, 3,4-pentanediol, 1,5-pentanediol, 1,2-hexanediol, 1,3-hexanediol, 1,4-hexanediol, 1,5-hexanediol, 2,3-hexanediol, 2,4-hexanediol, 2,5-hexanediol, 3,4-hexanediol, 1,6-hexanediol, 1,2-heptanediol, 1,3-heptanediol, 1,4-heptanediol, 1,5-heptanediol, 1,6-heptanediol, 1,7-heptanediol, 2,3-heptanediol, 2,4-heptanediol, 2,5-heptanediol, 2,6-heptanediol, 3,4-heptanediol, 3,5-heptanediol and octanediol; double bond-containing diols such as butenediol and hexenediol; and cyclic diols. The (a1) diol with a molecular weight of 40 or greater and less than 1000 and/or a resin containing the diol as a backbone may be a diol such as mentioned above or its polymer, or a resin containing a diol or diol backbone, with an alkyl group such as methyl or ethyl or a glycidyl ether on the ends or side chains of a diol such as mentioned above. Any of these may be used alone or in combinations of two or more.

The diol preferably has a molecular weight of 40 or greater and less than 1000 in order to increase the number of functional groups contributing to the reaction in the curing treatment during formation of a resistor, to obtain a liquid composition with excellent curability. The molecular weight is also preferably at least 40 and less than 500, and especially less than 200, in order to further increase the number of functional groups and the further improve the curability.

For a liquid composition according to the second embodiment, it is preferred for the (a1) diol with a molecular weight of 40 or greater and less than 1000 and/or a resin containing the diol as a backbone, to be (a2) an epoxy resin with a molecular weight of between 200 and 50,000, comprising a diol with a molecular weight of 40 or greater and less than 1000 in the backbone, as the resin comprising a diol with a molecular weight of 40 or greater and less than 1000 in the backbone. Examples for the (a2) epoxy resin with a molecular weight of between 200 and 50,000 comprising a diol with a molecular weight of 40 or greater and less than 1000 in the backbone, include epoxy resins comprising residues of the aforementioned diols, and more specifically they include compounds represented by the following formula (I). Any of these may be used alone or in combinations of two or more.

In formula (I), $Z^1$ and $Z^2$ each independently represent a divalent organic group, and n represents an integer of 1 or greater.

The (a2) epoxy resin comprising a diol backbone has a molecular weight of between 200 and 50,000. Using an epoxy resin with a molecular weight in this range can be expected to increase the heat resistance. Although the molecular weight of the diol backbone is 40 or greater and less than 1000, it is preferably 40 or greater and less than 500, and more preferably 40 or greater and less than 200.

In a liquid composition according to the second embodiment, the content of the (a2) epoxy resin comprising a diol backbone is preferably 10 to 99 mass %, more preferably 20 to 70 mass % and even more preferably 25 to 45 mass %, based on the total mass of the resin solid content in the liquid composition. If the content is less than 10 mass % the effect of addition will tend to be insufficiently exhibited, while if it exceeds 99 mass % the heat resistance or solvent resistance of the cured product will tend to be reduced.

A resin other than those mentioned above may also be added to liquid compositions according to the first and second embodiments. The resin may be any one so long as it generally exhibits electrical insulating properties, and examples include epoxy resins, phenol resins, polyimide resins, polyamide resins, polyamideimide resins, silicone-modified polyamideimide resins, polyester resins, cyanate ester resins, BT resins, acrylic resins, melamine resins, urethane resins and alkyd resins. These may be used alone or in combinations of two or more. When such a resin is to be used, a thermosetting resin is preferred from the viewpoint of insulating reliability, connection reliability and heat resistance, with epoxy resins, phenol resins, polyimide resins, polyamide resins and polyamideimide resins being especially preferred for their satisfactory mechanical properties.

Examples of epoxy resins include bisphenol A-type epoxy resins; bisphenol F-type epoxy resins; bisphenol S-type epoxy resins; biphenol-type epoxy resins; alicyclic epoxy resins; aliphatic chain epoxy resins; glycidyl ester-type epoxy resins; glycidyl etherified condensation products of phenols such as phenol, cresol, alkylphenol, catechol, bisphenol F, bisphenol A and bisphenol S with aldehydes such as formaldehyde or salicylaldehyde; glycidyl etherified products of bifunctional phenols; glycidyl etherified products of bifunctional alcohols; glycidyl etherified products of polyphenols; and hydrogenated or halogenated forms of any of the foregoing. Preferred among these, from the viewpoint of heat resistance and connection reliability, are glycidyl etherified condensation products of phenols and aldehydes. There are no particular restrictions on the molecular weight of such epoxy resins. The epoxy resins may be used alone or in combinations of two or more.

It is preferred to add (e) a curing agent to liquid compositions of the first and second embodiments. The (e) curing agent is preferably an epoxy resin curing agent. Examples for the (e) curing agent to be used with an epoxy resin include amines such as diethylenetriamine, triethylenetetramine,

[Chemical Formula 1]

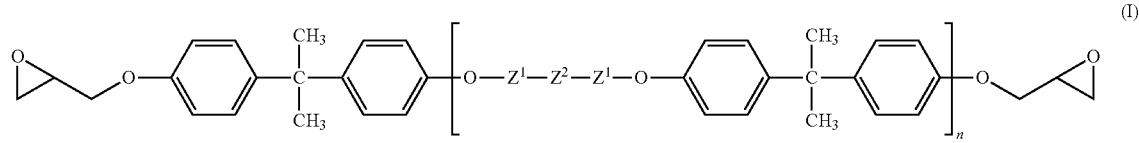

metaxylenediamine, diaminodiphenylmethane, diaminodiphenylsulfone, m-phenylenediamine and dicyandiamide; acid anhydrides such as phthalic anhydride, tetrahydrophthalic anhydride, hexahydrophthalic anhydride, methyltetrahydrophthalic anhydride, methylhexahydrophthalic anhydride, methylnadic anhydride, pyromellitic anhydride and trimellitic anhydride; phenols such as bisphenol F, bisphenol A, bisphenol S and polyvinylphenol; condensation products of phenols such as phenol, cresol, alkylphenol, catechol, bisphenol F, bisphenol A and bisphenol S with aldehydes such as formaldehyde and salicylaldehyde, and halogenated forms of the foregoing. Condensation products of phenols and aldehydes are preferred from the viewpoint of heat resistance and connection reliability. There are no particular restrictions on the molecular weights of these compounds. The curing agents may also be used alone or in combinations of two or more.

The proportion of the curing agent in the epoxy resin may be a proportion used in the prior art, and it is preferably in the range of 0.5 to 2.0 and more preferably 0.8 to 1.5 hydroxyl equivalents with respect to epoxy equivalents. When the (e) curing agent is dicyandiamide, for example, it is preferably in the range of 2 to 5 parts by mass with respect to 100 parts by mass of the epoxy resin.

An imidazole may also be used in a liquid composition according to the first or second embodiment, as a curing agent in addition to the aforementioned curing agents, or as a curing agent and an epoxy resin curing accelerator. Preferred imidazoles are those represented by the following formula (1).

[Chemical Formula 2]

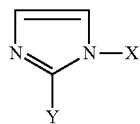
(1)

In formula (1), X and Y each independently represent hydrogen or a substituent including a carbon atom, hydrogen or nitrogen atom. The imidazole preferably satisfies either or both of the following conditions: a side chain other than hydrogen is bonded at position X, or a C3 or greater side chain is bonded at position Y, in formula (1). Using an imidazole satisfying such conditions can inhibit increase in the viscosity of the liquid composition.

Examples of imidazoles include imidazoles such as 2-undecylimidazole, 2-heptadecylimidazole, 2-phenylimidazole, 2-phenyl-4-methylimidazole, 1-benzyl-2-phenylimidazole, 1,2-dimethylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 1-cyanoethyl-2-undecylimidazolium trimellitate, 1-cyanoethyl-2-phenylimidazolium trimellitate, 2,4-diamino-6-[2'-methylimidazolyl-(1')]-ethyl-s-triazine, 2,4-diamino-6-[2'-undecylimidazolyl-(1')]-ethyl-s-triazine, 2,4-diamino-6-[2'-ethyl-4'-methylimidazolyl-(1')]-ethyl-s-triazine, 2,4-diamino-6-[2'-methylimidazolyl-(1')]ethyl-s-triazineisocyanuric acid addition product, 2-phenyl 4,5-dihydroxymethylimidazole and 2-phenyl-4-methyl-5-hydroxymethylimidazole; imidazoles having the imino groups masked with acrylonitrile, phenylene diisocyanate, toluidine isocyanate, naphthalene diisocyanate, methylene bisphenyl isocyanate, melamine acrylate or the like; and imidazoles such as 2-ethylimidazole, 2-ethyl-4-methylimidazole, 2-phenylimidazole, 2-undecylimidazole, 1-benzyl-2-methylimidazole, 2-heptadecylimidazole, 4,5-diphenylimidazole, 2-methylimidazoline, 2-phenylimidazoline, 2-undecylimidazoline, 2-heptadecylimidazoline, 2-isopropylimidazole, 2,4-dimethylimidazole, 2-phenyl-4-methylimidazole, 2-ethylimidazoline, 2-isopropylimidazoline, 2,4-dimethylimidazoline, 2-phenyl-4-methylimidazoline, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 1-cyanoethyl-2-undecylimidazolium trimellitate, 1-cyanoethyl-2-phenylimidazolium trimellitate, 2-phenyl-4,5-dihydroxymethylimidazole and 2-phenyl-4-methyl-5-hydroxymethylimidazole. These imidazoles may be used alone or in combinations of two or more different types.

The proportion of such imidazoles with respect to the epoxy resin may be a proportion used in the prior art, and it is preferably in the range of 0.001 to 15 parts by mass and more preferably in the range of 0.01 to 10 parts by mass with respect to 100 parts by mass of the epoxy resin. An imidazole amount of less than 0.001 part by mass will tend to result in curing defects, while an amount of greater than 15 parts by mass is not preferred because it can lead to reduced pot life of the prepared liquid composition.

The liquid composition according to the first embodiment comprises (d) a solvent with a vapor pressure of less than $1.34 \times 10^3$ Pa at 25° C. The liquid composition according to the second embodiment preferably comprises (d) a solvent with a vapor pressure of less than $1.34 \times 10^3$ Pa at 25° C. The vapor pressure of the (d) solvent at 25° C. is preferably at least 1.34 Pa. The (d) solvent may be any one that has a vapor pressure in the prescribed range and disperses or dissolves each of the components, including the insulating resin in the liquid composition, and examples include γ-butyrolactone, N,N-dimethylformamide, N,N-dimethylacetamide and cyclohexanone.

A liquid composition according to the first or second embodiment may contain a solvent with a vapor pressure of $1.34 \times 10^3$ Pa or higher at 25° C. in addition to the (d) solvent, and the mixing proportion of the solvent with a vapor pressure of $1.34 \times 10^3$ Pa or higher is preferably no greater than 60 mass %, more preferably no greater than 50 mass % and even more preferably no greater than 40 mass %, based on the total mass of the solvent. If the compositional ratio of the solvent is within this range, it will be possible to adjust the evaporation rate of the solvent and lower the viscosity of the liquid composition during printing, while also inhibiting flow of the ink after printing. The solvent with a vapor pressure of $1.34 \times 10^3$ Pa or higher at 25° C. may be any one that disperses or dissolves each of the components including the insulating resin in the liquid composition, and examples include methyl isobutyl ketone, methyl ethyl ketone and toluene.

These solvents may be used alone or in combinations of two or more.

The viscosity of a liquid composition according to the first or second embodiment is preferably no higher than 50 mPa·s and more preferably no higher than 30 mPa·s at 25° C. It is not preferred for the viscosity at 25° C. to exceed 50 mPa·s because the ink-jet discharge property will be impaired. From the same viewpoint, the viscosity at 25° C. is preferably at least 1 mPa·s.

A liquid composition according to the first or second embodiment may also comprise, as appropriate, other components in addition to those mentioned above, such as a curing accelerator, coupling agent, antioxidant, filler, surface control agent or the like.

A liquid composition according to the first or second embodiment may be prepared, for example, by using a disperser for dispersion of the conducting material ((b) carbon black particles and (c) CNT), in the form of a mixture of the aforementioned components other than the solvent, or with a solvent added thereto. The disperser used may be a kneader, triple roll mill, bead mill, sand mill or the like, either alone or in combinations. The conducting material can also be dispersed using an apparatus equipped with an ultrasonic oscillator. By accomplishing dispersion using such a disperser, it is possible to adequately reduce the mean dispersion particle size of the (b) carbon black particles. When air bubbles have been generated in the liquid composition after dispersion, the air bubbles are preferably removed by standing under reduced pressure or by stirring under reduced pressure.

It is also preferred to use a dispersing agent suited for the (b) carbon black particles or (c) CNT. This will facilitate reduction in the maximum dispersion particle size or mean dispersion particle size of the (b) carbon black particles, while also increasing the dispersion stability of the (b) carbon black particles. The dispersing agent may be any one that can disperse the (b) carbon black particles in such a manner that their maximum dispersion particle size or mean dispersion particle size is in the prescribed range. In order to limit the maximum dispersion particle size of the (b) carbon black particles to no greater than 2 µm, the liquid composition may be filtered with a filter having an opening diameter of no greater than 2 µm. This can help increase the yield when preparing the liquid composition.

A liquid composition according to the first or second embodiment, prepared as described above, can be most suitably used as a printing ink for formation of a resistor film.

The method of forming a resistor film using the liquid composition may be any of various printing methods, including screen printing, relief printing, gravure printing, ink jet printing, nanoimprinting, contact printing, spin coat printing, or a printing method using a dispenser device. Particularly preferred among these is ink jet printing, because it allows printing of a prescribed amount of ink at prescribed locations without using a special plate, and because it can easily meet the needs for material utilization efficiency and pattern design variation.

The ink jet printing method used may employ a commonly reported discharge process such as, for example, a piezo system wherein the liquid is discharged by vibration of a piezo element, or a thermal system wherein expansion of the liquid by rapid heating is utilized for discharge of the liquid. Piezo systems are especially preferred from the viewpoint of avoiding heating the ink. Common ink-jet apparatuses may be used for such ink jet printing methods. The nozzle diameter of the head through which the ink is discharged may be selected as optimal for the prescribed droplet size.

A resin composite material film (resistor film) may be obtained by printing the liquid composition on a substrate by the printing method and then removing the solvent in the liquid composition by drying, and finally curing the resin composition. The method for removing the solvent after the liquid composition has been printed on the board may be a method of heat treatment by heating the board or blowing hot air onto it. Such heat treatment may be carried out, for example, at a heating temperature of 50° C. to 250° C. for a heating time of 0.1 to 2.0 hours. The resin composition may also be cured by the same method. The solvent may alternatively be removed in a vacuum environment.

The substrate is not particularly restricted so long as it is a material commonly used as a substrate for circuit boards. Examples of substrates that may be used include insulating resin laminated sheets with glass cloths, insulating layers or insulating films that do not employ glass cloths, glass substrates, or metal foils such as copper foils and stainless steel foils, which may be selected depending on the purpose. In order to obtain uniform printability on the substrate, the surface may be cleaned or leveled by UV treatment or plasma treatment using oxygen or argon, before the liquid composition is printed. A metal electrode or wiring may also be formed beforehand by etching of a copper foil on the board, or by plating, vapor deposition or sputtering.

The resin composite material film (resistor film) prepared from the liquid composition may be used as a printed resistor (resistor element). The resistance value of the printed resistor can be designed by the volume resistivity of the resistor film and the thickness, width and length of the resistor film to be formed. If necessary, the resistance value can be adjusted by trimming using a laser or the like.

Also, by performing wiring formation or mounting of active components and passive elements on the same board, these may be combined with resistor elements formed on a board by the printing method described above, for use as a circuit board.

The liquid composition of the invention can provide a material for formation of resistors with different volume resistivities without changing the type of carbon black particles, since it allows the volume resistivity to be lowered by simple addition of CNT, and it can provide a material for formation of a resistor that exhibits stable volume resistivity even after heat curing.

Figure 2:
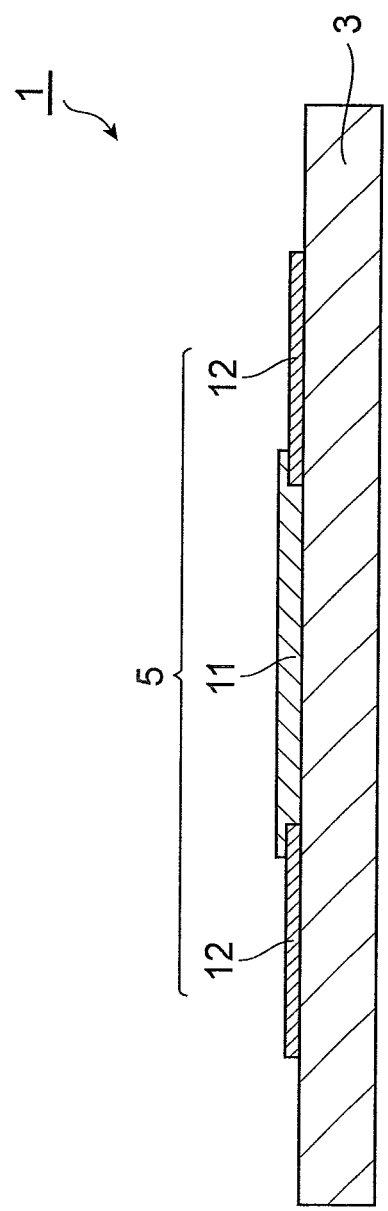
FIG. 2 is an end view of FIG. 1 along line II-II.

FIG. 1 is a perspective view showing an embodiment of a circuit board according to the invention, and FIG. 2 is an end view of FIG. 1 along line II-II. The circuit board 1 shown in FIGS. 1 and 2 comprises a laminar substrate 3 and a resistor element 5 provided on one side thereof. The resistor element 5 has conductor films 12,12 forming a pair of electrodes and a resistor film 11 comprising a resistor formed so as to electrically connect the conductor films 12,12. The thickness of the resistor film 11 is not particularly restricted, but will typically be 200 to 500,000 nm.

As mentioned above, the resistor film 11 can be formed by a method in which a liquid composition of the invention is printed or coated in contact with the conductor films 12 on the substrate 3 to form a film of the liquid composition, and the solvent is removed from the film of the liquid composition by heating. When the resin is a thermosetting resin, the resin cures as the solvent is removed. That is, the resistor film 11 comprises the cured thermosetting resin and a conducting material. As will be understood by a person skilled in the art, the heating conditions for forming the resistor film 11 may be appropriately adjusted according to the type of resin and solvent, such that the solvent is sufficiently removed and curing of the resin sufficiently proceeds.

The conductor film 12 is a film formed by a conductor such as copper. The method of forming the conductor film 12 is not particularly restricted, and for example, the conductor film 12 may be formed by copper foil etching, copper plating, or silver wiring printing by ink jet printing.

The substrate 3 which is used may be an insulating substrate such as a paper phenol insulating sheet, glass/bismaleimide insulating sheet or glass/polyimide insulating sheet, a plastic film of polyimide or polyethylene naphthalate to be used for a flexible circuit board, or a glass substrate.

EXAMPLES

The present invention will now be explained in more specific detail through the following examples, with the understanding that the invention is in no way limited thereby.

The viscosities of the liquid compositions of the examples and comparative examples were measured at 25° C. using a small oscillating viscometer (trade name: CJV5000) by A&D Co., Ltd. The mean dispersion particle size and maximum dispersion particle size of the carbon black particles in the liquid composition were measured at 25° C. using a submicron particle analyzer (Model N5) by Beckman Coulter, Inc. The volume resistivity of the cured liquid composition was measured using a LORESTA GP (trade name) by Mitsubishi Chemical Corp.

Example 1-1

A 100 g portion of a carbon black slurry (carbon black particle content: 20 mass %, mean dispersion particle size: 115 nm, maximum dispersion particle size: 300 nm), obtained by dispersing carbon black particles (mean primary particle size: approximately 20 nm) in gamma-butyrolactone (25° C. vapor pressure: $2.3 \times 10^2$ Pa), was added to a resin solution comprising a mixture of 13.5 g of gamma-butyrolactone, 5.9 g of an epoxy resin (trade name: N-865 by DIC), 3.2 g of a phenol resin (trade name: VH-4170 by DIC) and 0.44 g of 1-cyanoethyl-2-methylimidazole (Tokyo Kasei Kogyo Co., Ltd.), and these were mixed to obtain a liquid mixture. To the liquid mixture there was added a CNT dispersion (CNT content: 2 mass %) which was a dispersion of carbon nanotubes (CNT) (outer diameter: 10-30 nm, length: 100-1000 nm) in gamma-butyrolactone, in an amount of 3 parts by mass (0.6 g) of CNT to 100 parts by mass of the carbon black particles, to obtain a liquid composition with a viscosity of 15 mPa·s, and carbon black particles with a mean dispersion particle size of 130 nm and a maximum dispersion particle size of 300 nm.

Example 1-2

A liquid composition with a viscosity of 18 mPa·s and having carbon black particles with a mean dispersion particle size of 140 nm and a maximum dispersion particle size of 300 nm was obtained by the same method as Example 1-1, except that for preparation of a liquid mixture, the amount of carbon black slurry was 110 g and the amount of gamma-butyrolactone was 12 g, and the amount of CNT dispersion added to the liquid mixture was adjusted so that the amount of CNT was 0.65 g (3 parts by mass of CNT with respect to 100 parts by mass of carbon black particles).

Comparative Example 1-1

A liquid composition with a viscosity of 15 mPa·s and having carbon black particles with a mean dispersion particle size of 130 nm and a maximum dispersion particle size of 300 nm was obtained by the same method as Example 1-1, except that no CNT dispersion was added.

Comparative Example 1-2

A liquid composition with a viscosity of 18 mPa·s and having carbon black particles with a mean dispersion particle size of 140 nm and a maximum dispersion particle size of 300 nm was obtained by the same method as Example 1-2, except that no CNT dispersion was added.

Comparative Example 1-3

A liquid composition with a viscosity of 12 mPa·s and having carbon black particles with a mean dispersion particle size of 140 nm and a maximum dispersion particle size of 300 nm was obtained by the same method as Example 1-1, except that the solvent used was methyl ethyl ketone (26° C. vapor pressure: $1.3 \times 10^4$ Pa) instead of gamma-butyrolactone.

Comparative Example 1-4

A liquid composition with a viscosity of 14 mPa·s and having carbon black particles with a mean dispersion particle size of 140 nm and a maximum dispersion particle size of 300 nm was obtained by the same method as Example 1-1, except that the solvent used was methyl isobutyl ketone (22° C. vapor pressure: $2.2 \times 10^3$ Pa) instead of gamma-butyrolactone.

(Printing Evaluation)

When the liquid compositions obtained in Examples 1-1 and 1-2 and Comparative Examples 1-1 to 1-4 were printed with an ink jet printing device, it was found that the liquid compositions of Examples 1-1 and 1-2 and Comparative Examples 1-1 and 1-2 could be satisfactorily coated without clogging of the ink-jet head. In contrast, with the liquid composition obtained in Comparative Example 1-3, clogging of the ink-jet head occurred and coating could not be accomplished. Also, while clogging did not occur for a short period with the liquid composition obtained in Comparative Example 1-4, after being left in a non-discharging state for more than 60 minutes and having repeated discharge, some nozzles were incapable of initial discharge.

(Measurement of Volume Resistivity)

Figure 3:
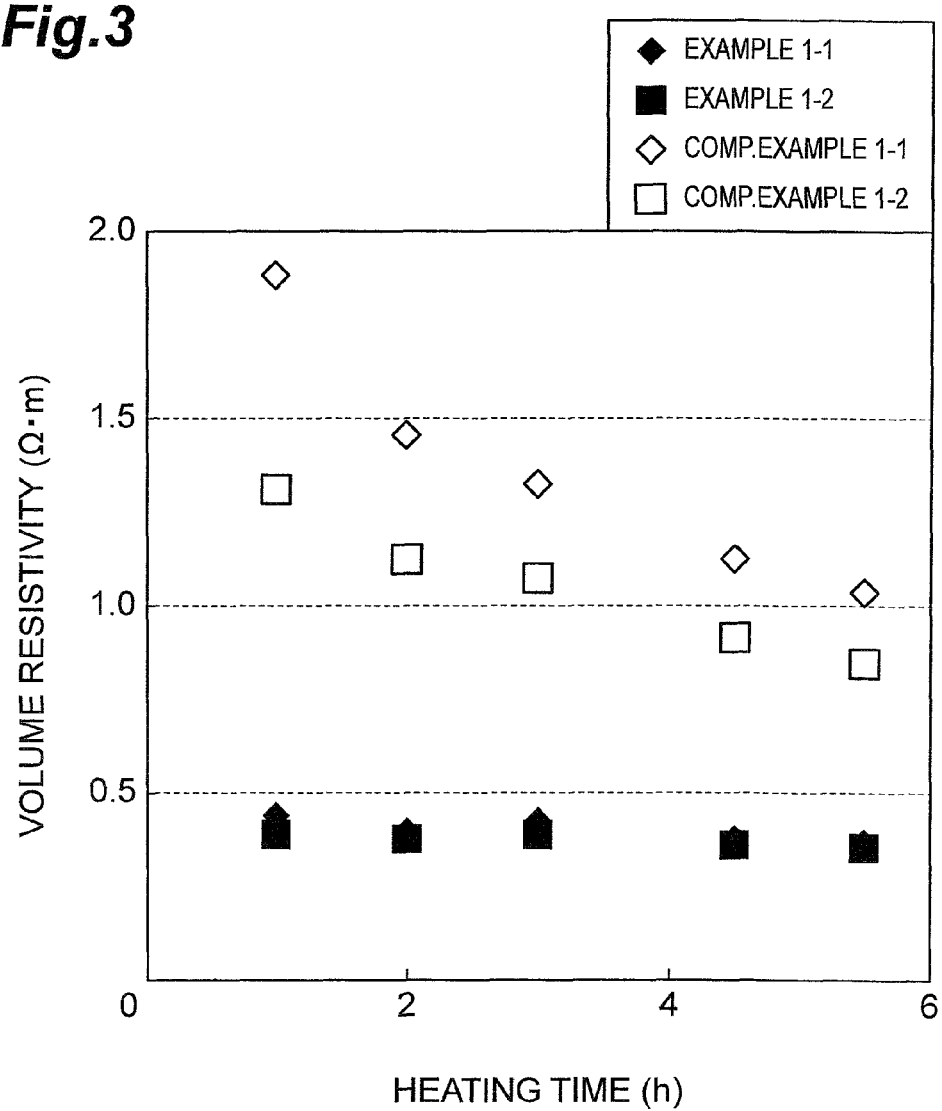
FIG. 3 is a graph showing the relationship between heat curing time and volume resistivity for the liquid compositions of the examples and comparative examples.

The liquid compositions obtained in Examples 1-1 and 1-2 and Comparative Examples 1-1 and 1-2 were sampled in an amount of 100 μL with a micropipette and dropped onto a glass plate. The samples were heat cured for a prescribed time at 210° C. The volume resistivities of the cured products were measured at heat curing times of 1, 2, 3, 4.5 and 5.5 hours, producing the results shown in FIG. 3. As a result, with the liquid compositions of Examples 1-1 and 1-2, stable, low volume resistivity was obtained with low variation in volume resistivity even when the heating time was further extended beyond 1 hour, whereas with the liquid compositions of Comparative Examples 1-1 and 1-2, the volume resistivity varied with time and the volume resistivity was higher than in the examples.

Example 2-1

A 100 g portion of a carbon black slurry (carbon black particle content: 20 mass %, mean dispersion particle size: 115 nm, maximum dispersion particle size: 300 nm), obtained by dispersing carbon black particles (mean primary particle size: approximately 20 nm) in gamma-butyrolactone (25° C. vapor pressure: $2.3 \times 10^2$ Pa), was added to a resin solution comprising a mixture of 13.5 g of gamma-butyrolactone, 6.1 g of an epoxy resin with a molecular weight of 900, comprising a diol backbone with a molecular weight of 40 or greater and less than 1000 (trade name: EXA4850-150 by DIC), 1.6 g of a phenol resin (trade name: VH-4170 by DIC) and 0.47 g of 1-cyanoethyl-2-methylimidazole (Tokyo Kasei Kogyo Co., Ltd.), and these were mixed to obtain a liquid composition with a viscosity of 15 mPa·s and having carbon black particles with a mean dispersion particle size of 140 nm and a maximum dispersion particle size of 300 nm.

Example 2-2

To the liquid composition obtained in Example 2-1 there was added a CNT dispersion (CNT content: 2 mass %) which was a dispersion of carbon nanotubes (CNT) (outer diameter:

10-30 nm, length: 100-1000 nm) in gamma-butyrolactone, in an amount of 3 parts by mass (0.6 g) of CNT to 100 parts by mass of the carbon black particles, to obtain a liquid composition with a viscosity of 17 mPa·s, and carbon black particles with a mean dispersion particle size of 130 nm and a maximum dispersion particle size of 300 nm.

Comparative Example 2-1

A 100 g portion of a carbon black slurry (carbon black particle content: 20 mass %, mean dispersion particle size: 115 nm, maximum dispersion particle size: 300 nm), obtained by dispersing carbon black particles in gamma-butyrolactone was added to a resin solution comprising a mixture of 13.5 g of gamma-butyrolactone, 5.9 g of a bisphenol A-novolac-type epoxy resin comprising no diol backbone (trade name: N865 by DIC), 3.2 g of a phenol resin (trade name: VH-4170 by DIC) and 0.44 g of 1-cyanoethyl-2-methylimidazole (Tokyo Kasei Kogyo Co., Ltd.), and these were mixed to obtain a liquid composition with a viscosity of 15 mPa·s and having carbon black particles with a mean dispersion particle size of 130 nm and a maximum dispersion particle size of 300 nm.

Comparative Example 2-2

A liquid composition with a viscosity of 20 mPa·s and having carbon black particles with a mean dispersion particle size of 130 nm and a maximum dispersion particle size of 300 nm was obtained by the same method as Comparative Example 2-1, except that the amount of carbon black slurry was 110 g and the amount of gamma-butyrolactone was 11.9 g.

(Printing Evaluation)

When the liquid compositions obtained in Examples 2-1 and 2-2 and Comparative Examples 2-1 and 2-2 were printed with an ink jet printing device, it was found that they could be satisfactorily coated without clogging of the ink-jet head.

(Measurement of Volume Resistivity)

Figure 4:
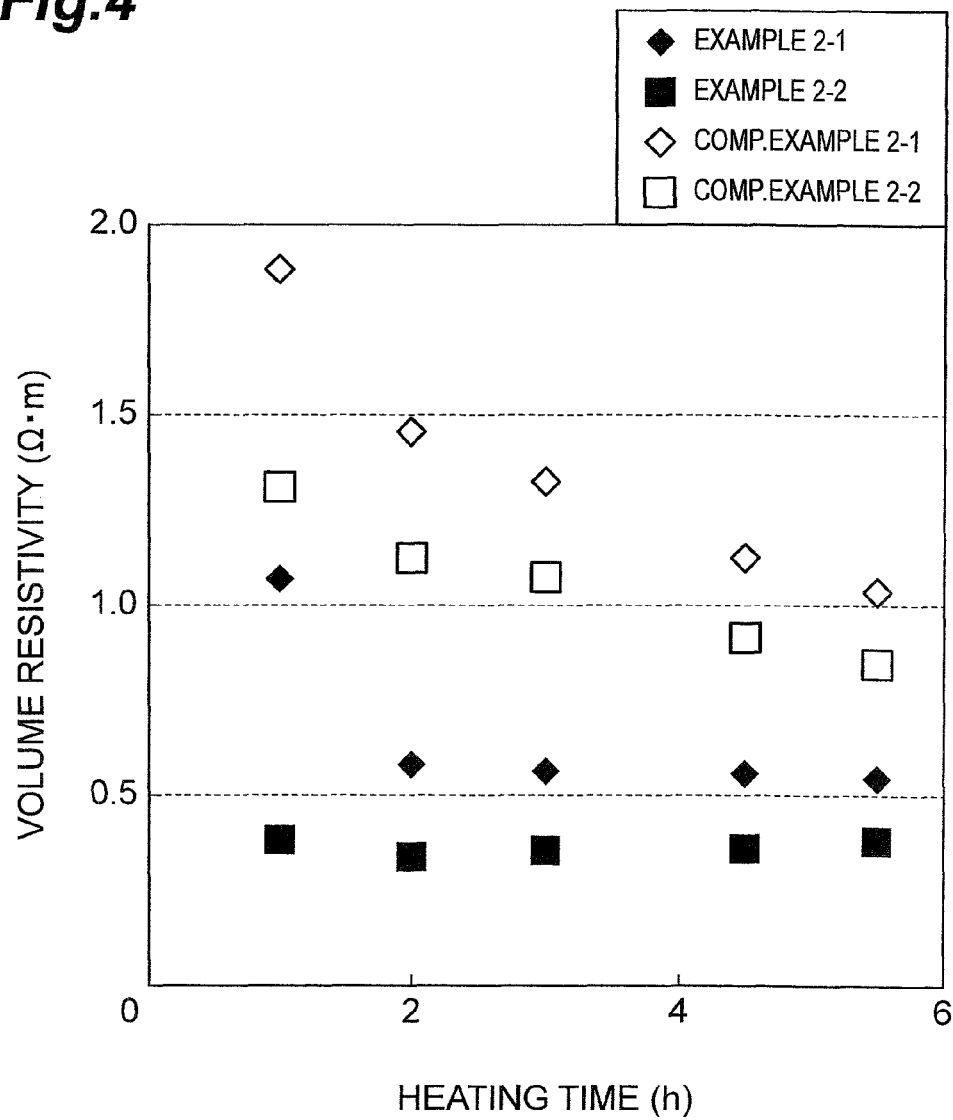
FIG. 4 is a graph showing the relationship between heat curing time and volume resistivity for the liquid compositions of the examples and comparative examples.

The liquid compositions obtained in Examples 2-1 and 2-2 and Comparative Examples 2-1 and 2-2 were sampled in an amount of 100 μL with a micropipette and dropped onto a glass plate. The samples were heat cured for a prescribed time at 210° C. The volume resistivities of the cured products were measured at heat curing times of 1, 2, 3, 4.5 and 5.5 hours, producing the results shown in FIG. 4. As a result, with the liquid compositions of Examples 2-1 and 2-2, the variation in volume resistivity was low even when the heating time was further extended beyond 2 hours, while stable, low volume resistivity was obtained for 2 hours thereafter, whereas with the liquid compositions of Comparative Examples 2-1 and 2-2, the volume resistivity varied with time and the volume resistivity was higher than in the examples. With the liquid composition of Example 2-2, it was confirmed that the stabilization time for the volume resistivity was more rapid than with the liquid composition of Example 2-1.

INDUSTRIAL APPLICABILITY

According to the invention it is possible to obtain a liquid composition that is suitable for forming resistors by ink jet printing and that can exhibit a stable resistance value, as well as a resistor film, resistor element and circuit board using the liquid composition.

EXPLANATION OF SYMBOLS

1: Circuit board, 3: substrate, 5: resistor element, 11: resistor film, 12: conductor film.

The invention claimed is:

1. A liquid composition comprising
   (a) an epoxy resin,
   (b) carbon black particles,
   (c) carbon nanotubes, the carbon nanotubes having an outer diameter of 3 nm or greater and a length greater than or equal to 100 nm and less than or equal to 15 μm,
   (d) a solvent with a vapor pressure of less than $1.34 \times 10^3$ Pa at 25° C., and
   (e) having a viscosity allowing for discharge from an ink-jet apparatus,
   wherein the content of the (c) carbon nanotubes is 0.1 to 10 parts by mass with respect to 100 parts by solid mass of the (b) carbon black particles.

2. The liquid composition according to claim 1, wherein the mean dispersion particle size of the (b) carbon black particles is no greater than 500 nm, and the maximum dispersion particle size is no greater than 2 μm.

3. The liquid composition according to claim 1, wherein the content of the (b) carbon black particles is 10 to 80 vol %, based on the total solid volume of the liquid composition.

4. The liquid composition according to claim 1, wherein the viscosity is no greater than 50 mPa·s at 25° C.

5. The liquid composition according to claim 1, wherein the (a) epoxy resin is a glycidyl etherified condensation product of a phenol and an aldehyde.

6. The liquid composition according to claim 1, which further comprises (e) a curing agent, the (e) curing agent comprising the condensation product of a phenol and an aldehyde.

7. A resistor film formed by removing the solvent from the liquid composition according to claim 1 by heating.

8. A resistor element having the resistor film according to claim 7.

9. A circuit board having the resistor element according to claim 8 formed on a substrate.

10. A resistor film formed by printing or coating the liquid composition according to claim 1 on a substrate to form a film of the liquid composition, and removing the solvent from the film of the liquid composition by heating.

11. A resistor element having the resistor film according to claim 10.

12. A circuit board having the resistor element according to claim 11 formed on a substrate.

* * * * *